United States Patent
Jiang et al.

(10) Patent No.: US 7,817,424 B2
(45) Date of Patent: Oct. 19, 2010

(54) HEAT SINK ASSEMBLY INCLUDING A HEAT PIPE AND A DUCT

(75) Inventors: Yu-Ling Jiang, Shenzhen (CN); Zhi-Jiang Yao, Shenzhen (CN); Ning-Yu Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 247 days.

(21) Appl. No.: 12/240,028

(22) Filed: Sep. 29, 2008

(65) Prior Publication Data

US 2010/0002390 A1    Jan. 7, 2010

(30) Foreign Application Priority Data

Jul. 7, 2008    (CN) .................. 2008 2 0301461

(51) Int. Cl.
*H05K 5/00* (2006.01)
*H05K 7/20* (2006.01)
*H01L 23/34* (2006.01)
*F28F 7/00* (2006.01)

(52) U.S. Cl. ............. 361/700; 361/679.47; 361/679.49; 361/679.52; 361/697; 174/15.2; 174/16.3; 257/715; 257/722; 165/80.3; 165/80.4; 165/80.5; 165/104.33

(58) Field of Classification Search ............ 361/679.47, 361/679.48, 679.49, 679.51, 679.52, 695, 361/697, 700; 174/15.2, 16.1, 16.3; 257/713, 257/715, 721, 722; 165/80.2–80.5, 104.33, 165/185

See application file for complete search history.

(56) References Cited

U.S. PATENT DOCUMENTS

| | | | |
|---|---|---|---|
| 6,430,042 B1 * | 8/2002 | Ohashi et al. | 361/679.49 |
| 7,163,050 B2 * | 1/2007 | Wang et al. | 165/104.33 |
| 7,443,680 B1 * | 10/2008 | Peng et al. | 361/704 |

* cited by examiner

*Primary Examiner*—Zachary M Pape
(74) *Attorney, Agent, or Firm*—Clifford O. Chi

(57) ABSTRACT

A heat sink assembly includes an air duct, a heat sink and a fan. The air duct defines an air guiding channel therein. The heat sink is configured to contact a heat source to dissipate heat from a heat source. The heat sink includes a plurality of heat pipes. The heat sink is placed on one side of the air guiding channel, and the heat pipes contacts the air duct to transmit heat to the air duct. The fan is placed on the other side of the air guiding channel to communicate with the heat sink via the air duct. The fan forces air to flow through the air guiding channel to the heat sink to dissipate heat on the air duct and the heat sink.

9 Claims, 4 Drawing Sheets

HEAT SINK ASSEMBLY INCLUDING A HEAT PIPE AND A DUCT

BACKGROUND

1. Technical Field

The present invention relates to a heat sink assembly for dissipating heat generated by heat sources.

2. Description of Related Art

Electronic devices generate heat during operation. Thermal management refers to the ability to keep temperatures of the electronic devices must be kept within a prescribed range.

Historically, electronic devices were cooled by natural convection. The enclosures of the devices include strategically defined openings that allow hot air to escape and cool air to be drawn into the enclosures.

With the advent of high performance electronic devices, more innovative thermal management is required. Increases in processing speed and power have lead to more heat being generated, such that natural convection is no longer a sufficient cooling method on its own.

One common method of cooling electronic devices includes thermally coupling a heat sink to the electronic device. A typical heat sink is made from a highly thermal conductive material (e.g., copper, aluminum), and includes a plurality of fins projecting from a body of the heat sink. The fins give the heat sink a larger surface area to dissipate a greater amount of heat from the electronic device into the surrounding environment.

However, as electronic devices become more compact and powerful, the size of heat sinks becomes a problem.

Therefore, a light and efficient heat sink assembly is desired to overcome the above-described deficiency.

DETAILED DESCRIPTION OF THE EMBODIMENTS

Figure 1:
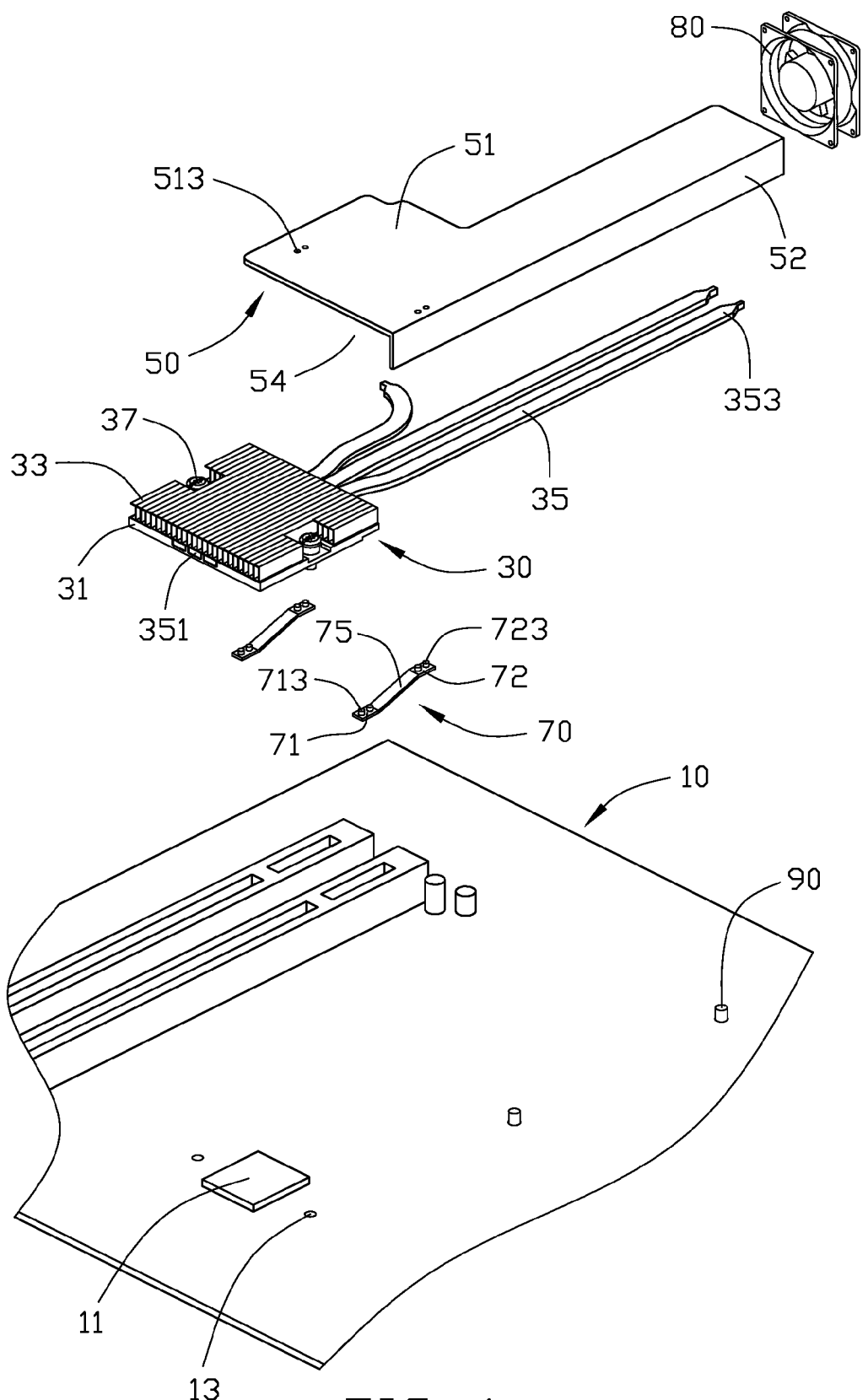
FIG. 1 is an exploded, isometric view of an embodiment of a heat sink assembly and a circuit board with a heat source.
Figure 2:
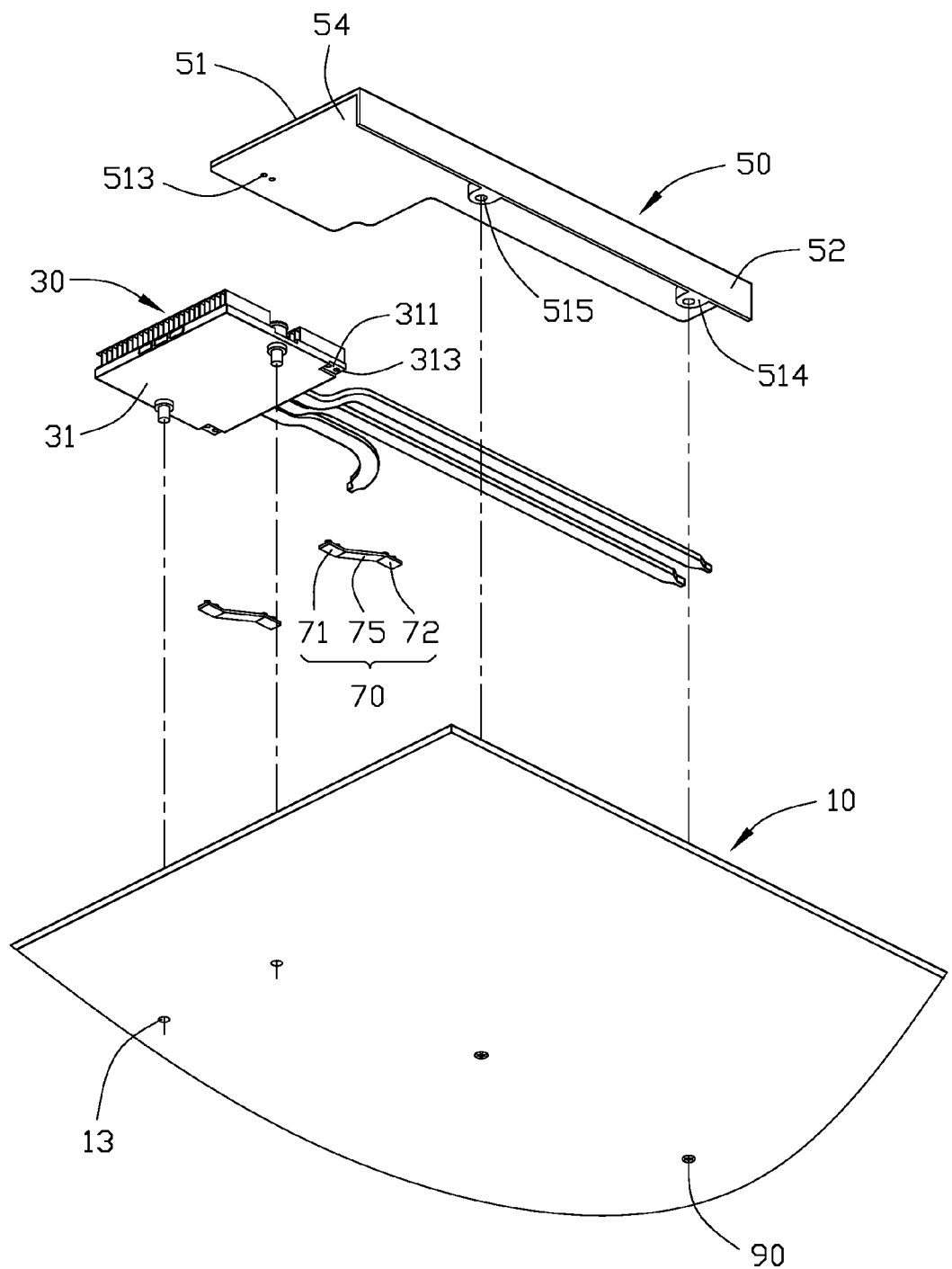
FIG. 2 is an exploded, isometric view similar to FIG. 1, but viewed from another aspect.

Referring to FIGS. 1 and 2, a heat sink assembly includes a heat sink 30, a fan 80, and an air duct 50. The heat sink assembly is configured to cool a heat source 11, which is mounted on a circuit board 10. In the embodiment, the heat source 11 is a chipset, such as a CPU or a graphic chipset. The circuit board 10 defines a pair of mounting holes 13 adjacent to the heat source 11. A pair of positioning posts 90 is formed on the circuit board 10.

The heat sink 30 includes a base 31, a plurality of fins 33 extending from a top surface of the base 31, and a plurality of heat pipes 35. Each heat pipe 35 includes a mounting end 351 mounted in the base 31, and a conducting end 353 located outside of the base 31. A pair of screws 37 is mounted on the base 31 to attach the heat sink 30 to the circuit board 10. A pair of recesses 311 is defined in a bottom of the base 31. Each recess 311 defines a pair of first securing holes 313 therein.

The air duct 50 is made from a highly thermal conductive material (e.g., copper, aluminum). The air duct 50 includes a first guiding wall 51 and a second guiding wall 52 extending from an edge of the first guiding wall 51. The first guiding wall 51 and the second guiding wall 52 cooperatively define an air guiding channel 54. Two pairs of second securing holes 513 are defined in the first guiding wall 51 corresponding to the first securing holes 313. A pair of seats 514 is formed on the second guiding wall 52. Each seat 514 defines a positioning hole 515 therein.

A pair of connecting pieces 70 is configured to connect the heat sink 30 to the air duct 50. Each connecting piece 70 includes an inclined connecting portion 75, a first end 71 formed on a low end of the connecting portion 75, and a second end 72 formed on a high end of the connecting portion 75. The first end 71 forms a pair of first inserting posts 713 thereon corresponding to the first securing holes 313 of the heat sink 30. The second end 72 forms a pair of second inserting posts 723 thereon corresponding to the second securing holes 513 of the air duct 50. A thickness of the connecting piece 70 is approximately equal to a depth of the recess 311.

Figure 3:
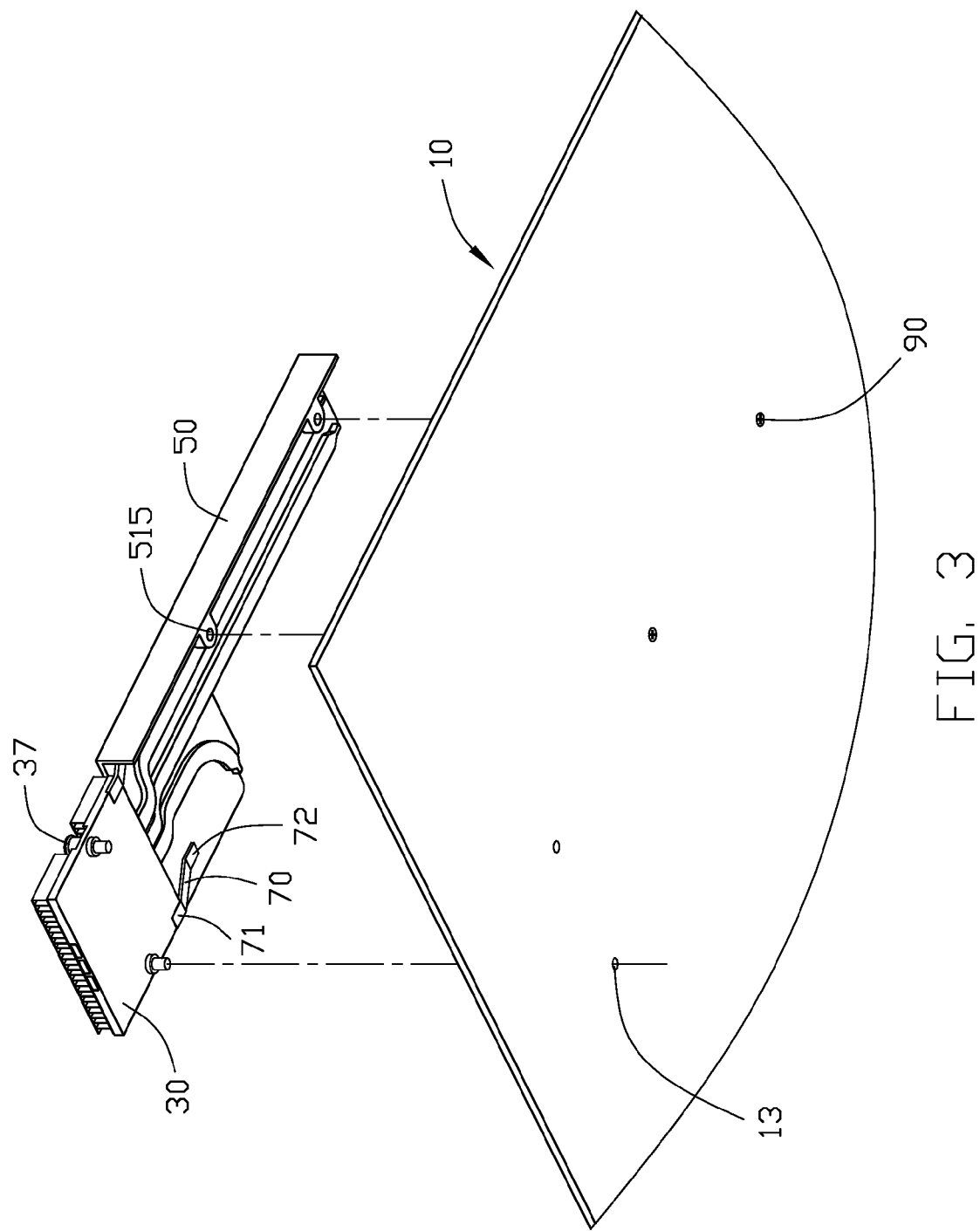
FIG. 3 is an assembled, isometric view of the heat sink assembly of FIG. 1, but viewed from another aspect.

Referring to FIG. 3, the first ends 71 of the connecting pieces 70 are placed in the recesses 311 of the heat sink 30. The first inserting posts 713 are inserted into the first securing holes 313 of the heat sink 30, and the second inserting posts 723 are inserted into the second securing holes 513 of the air duct 50. Thus, the heat sink 30 and the air duct 50 are connected together by the connecting pieces 70. The heat sink 30 faces a first side of the air guiding channel 54. The heat pipes 35 are covered by the air duct 50. The conducting ends 353 of the heat pipes 35 are tightly contacting an inner surface of the first guiding wall 51.

Figure 4:
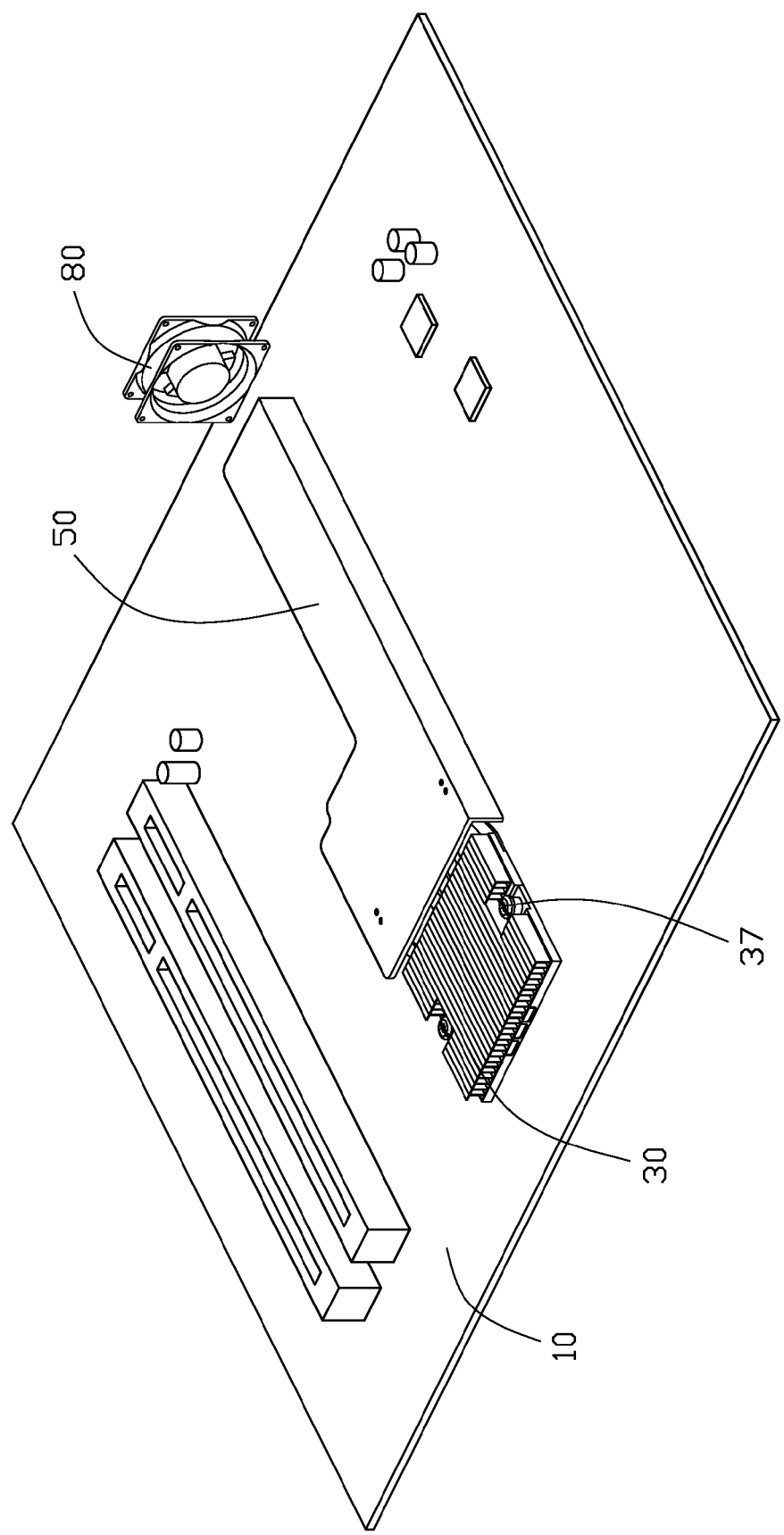
FIG. 4 is an assembled, isometric view of the heat sink assembly with the circuit board.

Referring to FIG. 4, the positioning posts 90 are aligned with the positioning holes 515, and inserted into the positioning holes 515. The combined heat sink 30 and the air duct 50 are attached to the circuit board 10 by engaging the screws 37 with the mounting holes 13. A bottom surface of the base 31 is contacting the heat source 11 to transfer heat from the heat source 11 to the heat sink 30. The fan 80 is placed facing a second side of the air guiding channel 54, so that the fan 80 communicates with the heat sink 30 via the air guiding channel 514. The second side of the air guiding channel 54 is opposite to the first side of the air guiding channel 54.

When the heat source 11 is operating, the heat is transferred to the fins 33 via the base 31 and to the air duct 50 via the heat pipes 35. Both the fins 33 and the air duct 50 have large surface areas, which favors dissipating heat. In addition, the fan 30 forces air to flow through the air guiding channel 54 to the heat sink 30.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising: an air duct defining an air guiding channel therein; a heat sink configured to contact a heat source to dissipate heat from the heat source, the heat sink comprising a plurality of heat pipes contacting the air duct to transfer heat to the air duct, wherein the heat sink is placed on a first side of the air guiding channel; and a fan configured to force air to flow through the air guiding channel to the heat sink to dissipate heat on the air duct and the heat sink, wherein the fan is placed on a second side of the air guiding channel to communicate the fan with the heat sink via the air duct; a connecting piece connecting the heat sink and the air duct together, wherein the connecting piece is inclined, and comprises a first end formed on a low end of the connecting piece, and a second end formed on a high end of the connecting piece; the first end is secured on the heat sink; the second end is secured on the air duct, wherein each of the first and second ends of the connecting piece comprises a plurality of inserting posts; the heat sink defines a plurality of first securing holes for receiving the inserting posts of the first end; the air duct defines a plurality of second securing holes for receiving the inserting posts of the second end.

2. The heat sink assembly of claim 1, wherein the air duct is made from a highly thermal conductive material.

3. The heat sink assembly of claim 1, wherein a plurality of recesses is defined in a bottom of the heat sink; a depth of the recess is substantially equal to a thickness of the connecting piece; the plurality of first securing holes are defined in the recess; the first end of the connecting piece is received in the recesses.

4. The heat sink assembly of claim 1, wherein the heat sink further comprises a base configured for contacting the heat source; each of the heat pipes having a mounting end mounted in the base, and a conducting end contacting the air duct.

5. A heat sink assembly comprising: a heat sink configured to contact a heat source to dissipate heat from a heat source, the heat sink comprising a plurality of heat pipes; an air duct for guiding air to the heat sink; wherein the heat pipes contacts the air duct to transfer heat to the air duct; a connecting piece connecting the heat sink and the air duct together, wherein the connecting piece is inclined, and comprises a first end formed on a low end of the connecting piece, and a second end formed on a high end of the connecting piece; the first end is secured on the heat sink; the second end is secured on the air duct, wherein each of the first and second ends of the connecting piece comprises a plurality of inserting posts; the heat sink defines a plurality of first securing holes for receiving the inserting posts of the first end of the connecting piece; the air duct defines a plurality of second securing holes for receiving the inserting posts of the second end of the connecting piece.

6. The heat sink assembly of claim 5, further comprising a fan, wherein the air duct defines an air guiding channel; the heat sink is placed on a first side of the air guiding channel; the fan is placed on a second side of the air guiding channel to communicate with the heat sink via the air guiding channel; the fan forces air to flow through the air guiding channel to the heat sink to dissipate heat on the air duct and the heat sink.

7. The heat sink assembly of claim 5, wherein a plurality of recesses is defined in a bottom of the heat sink; a depth of the recess is substantially equal to a thickness of the connecting piece; the plurality of first securing holes are defined in the recess; the first end of the connecting piece is received in the recesses.

8. The heat sink assembly of claim 5, wherein the heat sink further comprises a base configured for contacting a heat source; each of the heat pipes having a mounting end mounted in the base, and a conducting end contacting the air duct.

9. The heat sink assembly of claim 5, wherein the air duct is made from a highly thermal conductive material.

* * * * *